United States Patent
Furutani et al.

(12) 
(10) Patent No.: US 6,177,850 B1
(45) Date of Patent: Jan. 23, 2001

(54) TWO FREQUENCY FILTER COMPRISING AN INDUCTANCE DEVICE, A RESONATOR, AND A SWITCHING DEVICE

(75) Inventors: Koji Furutani, Moriyama; Norio Nakajima, Takatsuki; Ken Tonegawa, Otsu, all of (JP)

(73) Assignee: Murata Manufacturing Co., Ltd. (JP)

( * ) Notice: Under 35 U.S.C. 154(b), the term of this patent shall be extended for 0 days.

(21) Appl. No.: 09/229,615

(22) Filed: Jan. 13, 1999

(30) Foreign Application Priority Data

Jan. 13, 1998 (JP) .................................................. 10-004880

(51) Int. Cl.$^7$ ...................................................... H01P 1/20
(52) U.S. Cl. ............................ 333/185; 333/202; 333/205
(58) Field of Search ................................ 333/101, 104, 333/126–128, 129, 132, 134, 167, 174, 175, 176, 185, 202, 205, 207, 209, 223, 231, 235

(56) References Cited

U.S. PATENT DOCUMENTS

| | | | |
|---|---|---|---|
| 4,970,479 | * 11/1990 | Landt et al. | ...................... 333/175 X |
| 5,065,120 | * 11/1991 | Munn | ............................... 333/202 X |
| 5,065,121 | * 11/1991 | Ghadaksaz | ....................... 333/174 X |
| 5,521,561 | * 5/1996 | Yrjölä et al. | ....................... 333/104 X |
| 5,742,215 | * 4/1998 | Park | ................................... 333/202 X |
| 5,783,976 | * 7/1998 | Furutani et al. | .................. 333/104 X |

FOREIGN PATENT DOCUMENTS

| | | |
|---|---|---|
| 5-347541 | * 12/1993 | (JP) . |
| 9-200077 | * 7/1997 | (JP) . |
| 10-247833 | * 9/1998 | (JP) . |

* cited by examiner

*Primary Examiner*—Benny Lee
*Assistant Examiner*—Barbara Summons
(74) *Attorney, Agent, or Firm*—Ostrolenk, Faber, Gerb & Soffen, LLP

(57) ABSTRACT

The invention provides a filter, comprising: at least one inductance device, at least one resonator, and at least one switching device. The inductance device may be connected in parallel with said switching device, and the resonator may be connected in series with the switching device. The above filter is small in size that is capable of functioning for high-frequency signals of plural frequency bands which are relatively adjacent to each other.

4 Claims, 7 Drawing Sheets

TWO FREQUENCY FILTER COMPRISING AN INDUCTANCE DEVICE, A RESONATOR, AND A SWITCHING DEVICE

BACKGROUND OF THE INVENTION

1. Field of the Invention

The present invention relates to a filter for use in mobile communication apparatuses, such as portable or mobile telephones, that conform to the use for plural high-frequency bands.

2. Description of the Related Art

Hitherto, when two high-frequency bands of mobile communications are relatively adjacent to each other as in a case of a 900-MHz GSM (global system for mobile communications) and a 1.8-GHz DCS (digital cellular system), two mobile communication systems share a single antenna. FIG. 10 is a block diagram showing a structure in which two communication systems share a single antenna. In FIG. 10, 51 refers to an antenna, 52 refers to a duplexer, 53 refers to a GSM-side switch, and 54 refers to a DCS-side switch. The antenna 51 is connected to a first terminal 53a of the GSM-side switch 53 through the duplexer 52, and a GSM transmitter circuit Txgsm and a GSM receiver circuit Rxgsm are connected to a second terminal 53b and a third terminal 53c, respectively. Furthermore, the antenna 51 is connected to a first terminal 54a of the DCS-side switch 54 through the duplexer 52, and a DCS transmitter circuit Txdcs and a DCS receiver circuit Rxdcs are connected to a second terminal 54b and a third terminal 54c, respectively. The frequency band is thus separated for the GSM and the DCS through the duplexer 52, and transmit/receive switching is performed by the GSM-side switch 53 and the DCS-side switch 54. By this arrangement, transmitting-receiving communication between the two mobile communication systems GSM and DCS, sharing a single antenna, can be achieved.

However, in such a conventional structure sharing a single antenna, the antenna is connected to the GSM switch and the DCS switch through the duplexer, and through these switches, the antenna is further connected to the transmitter circuits and the receiver circuits; in which a problem arises with the increased number of constituent members. This problem makes it difficult to reduce the size of the mobile communication apparatus mounting the aforementioned constituent members.

SUMMARY OF THE INVENTION

To overcome the problems described above, preferred embodiments of the present invention provide a smaller-sized filter that is capable of functioning for high-frequency signals of plural frequency bands which are relatively adjacent to each other.

One preferred embodiment of the present invention provides a filter, comprising: at least one inductance device, at least one resonator, and at least one switching device. The inductance device may be connected in parallel with said switching device, and the resonator may be connected in series with the switching device.

According to the above described structure and arrangement, since it comprises an inductance device, a resonator, and a switching device, an equivalent circuit of a circuit formed of the inductance device, the resonator, and the switching device can be changed by controlling the voltage applied to the switching device. This allows the frequency band of high-frequency signals which pass through the filter to be changed; in which a single filter is enabled to sufficiently function for two high-frequency signals having two different frequency bands. Accordingly, mobile communication apparatuses having this filter can be smaller.

Furthermore, an antenna and a transmitting high-output amplifier can be shared by use of this filter in mobile communication apparatuses of plural frequency bands that are relatively adjacent to each other.

In the above described filter, the inductance device, the resonator, and the switching device may be disposed in or mounted on a multilayered body comprising a plurality of dielectric layers.

According to the above described structure and arrangement, since it is formed of a multilayered body, an inductance device, capacitance device, and switching device can be disposed in or mounted on the multilayered body. This allows the filter to be formed smaller.

In the above described filter, the resonator may be an open-stub resonator.

According to the above described structure and arrangement, it is not influenced by parasitic inductance of the pin diode; therefore, a greater insertion-loss attenuation can be established.

Other features and advantages of the present invention will become apparent from the following description of the invention which refers to the accompanying drawings.

DESCRIPTION OF THE PREFERRED EMBODIMENTS

Figure 1:
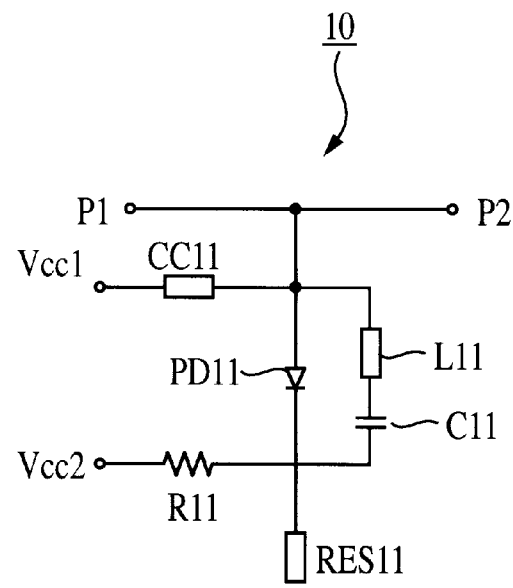
FIG. 1 is a circuit diagram of a filter according to a first preferred embodiment of the present invention.

FIG. 1 is a circuit diagram of a filter of a first preferred embodiment in accordance with the present invention. A filter 10 is a low-pass filter and is formed of a transmission line L11 which is an inductance device, an open-stub resonator RES11, a pin diode PD11 which is a switching device, a capacitor C11, a choke coil CC11, and a resistor R11.

The pin diode PD11 and the open-stub resonator RES11 are T-connected between a first port P1 and a second port P2, and a series circuit formed of the transmission line L11 and the capacitor C11 are parallel-connected to the pin diode PD11.

A control terminal Vcc1 is connected to a junction of the transmission line L11 and an anode of the pin diode PD11 through the choke coil CC11. Further, a control terminal Vcc2 is connected to a junction of the capacitor C11 and a cathode of the pin diode PD11 through the resistor R11.

In this case, the capacitor C11 prevents a direct current from flowing into the transmission line L11. Furthermore, the choke coil CC11 and the resistor R11 prevent a high-frequency signal from leaking to the control terminals Vcc1 and Vcc2 when voltage is applied to the pin diode PD11. it is especially notable that the resistor R11 also reduces power consumption.

Figure 2:
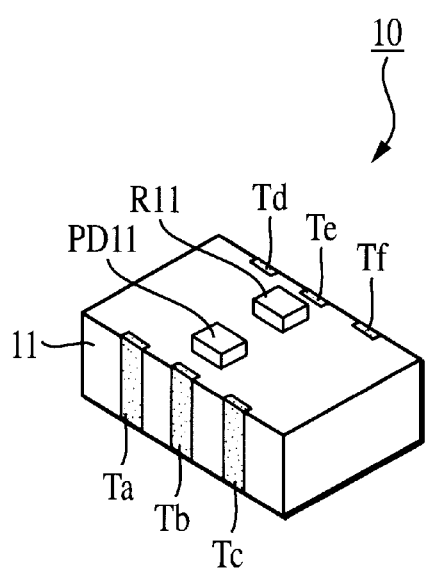
FIG. 2 is a perspective view of the filter in FIG. 1.
Figure 3A:
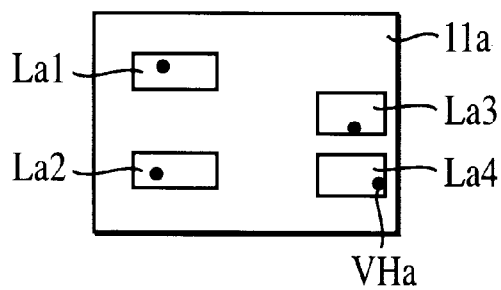
FIGS. 3A to 3H are upper-surface plan views of a first dielectric layer to an eighth dielectric layer which constitute a multilayered body of the filter in FIG. 2.
Figure 3B:
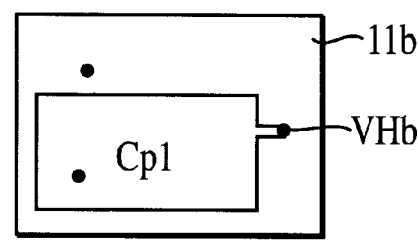
Figure 3C:
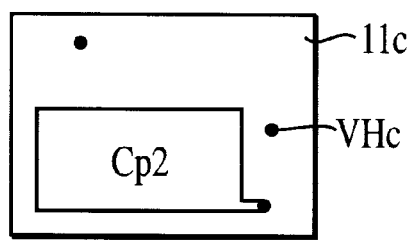
Figure 3D:
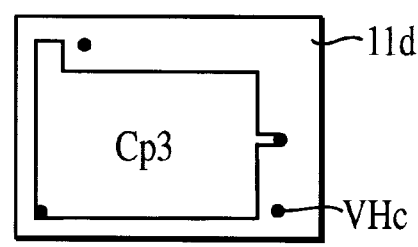
Figure 3E:
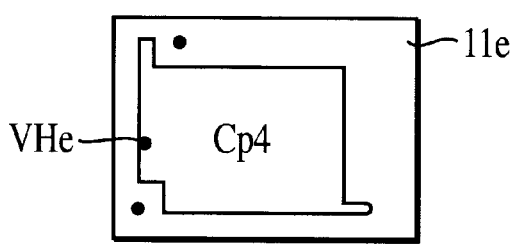
Figure 3F:
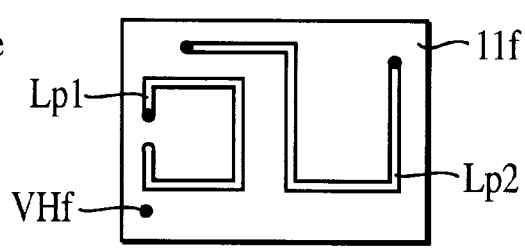
Figure 3G:
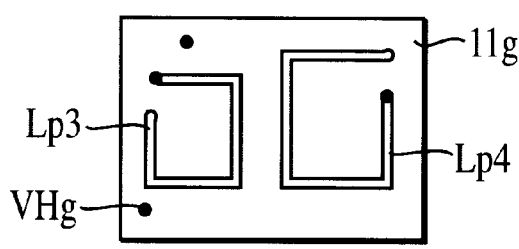
Figure 3H:
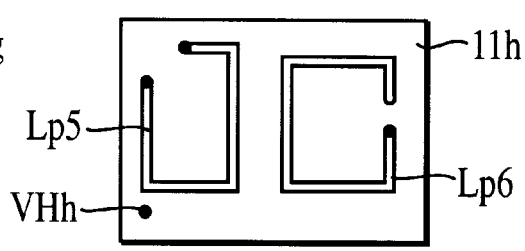
Figure 4A:
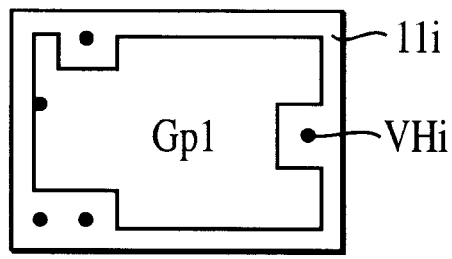
FIGS. 4A to 4E are upper-surface plan views of a ninth dielectric layer to a thirteenth dielectric layer which constitute the multilayered body of the filter in FIG. 2.
Figure 4B:
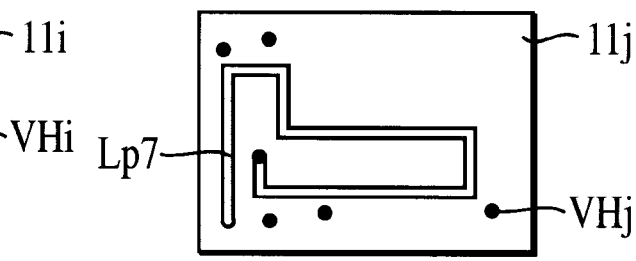
Figure 4C:
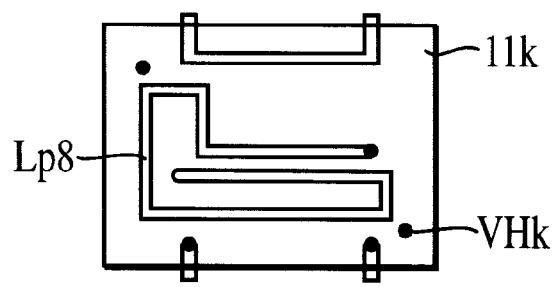
Figure 4D:
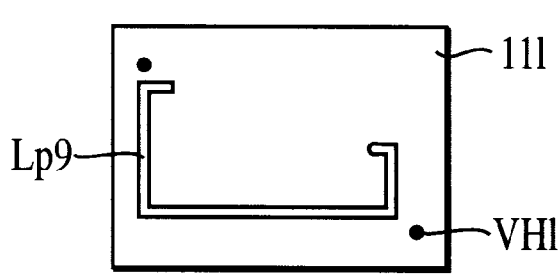
Figure 4E:
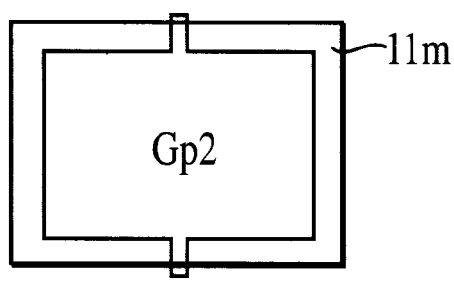
Figure 4F:
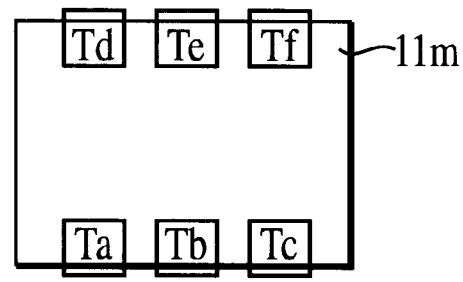
FIG. 4F is a lower-surface plan view of the thirteenth dielectric layer.

FIG. 2 shows a perspective view of the filter 10 shown in FIG. 1. This filter 10 comprises a multilayered body 11, inside which are provided a strip conductor (not shown) forming the transmission line L11, a capacitor electrode (not shown) forming the capacitor C11, a strip conductor (not shown) forming the resonator RES11, and a strip conductor (not shown) forming the choke coil CC11. On an upper surface, which is one of the principal planes of the multilayered body 11, the pin diode PD11 and the resistor R11 are mounted.

Furthermore, six external electrodes Ta to Tf are provided such that they reach from the upper surface to the lower surface through the lateral surfaces of the multilayered body 11. Of these external electrodes Ta to Tf, the three external electrodes Ta to Tc are formed through the one lateral face of the multilayered body 11, and the other three external electrodes Td to Tf are formed through the other lateral surface of the multilayered body 11. The external electrode Ta functions as the first port P1, the external electrodes Tb and Te function as grounding terminals, the external electrode Tc functions as the second port P2, and the external electrodes Td and Tf respectively function as the control terminals Vcc1 and Vcc2 that control the voltage applied to the pin diode PD.

FIGS. 3A to 3H and FIGS. 4A to 4F are upper-surface plan views and lower-surface plan views of dielectric layers that constitute the multilayered body 11 of the filter 10. The multilayered body 11 is formed in such a manner that first to thirteenth dielectric layers 11a to 11m are layered sequentially from the top toward the bottom.

On the first dielectric layer 11a are print-formed lands La1 to La4 on which the pin diode PD11 and the resistor R11 are mounted. On respective upper surfaces of the second to fifth dielectric layers 11b to 11e, capacitor electrodes Cp1 to Cp4 which are formed of conducting layers are print-formed. Further, on respective upper surfaces of the sixth to the eighth dielectric layers 11f to 11h, the tenth dielectric layer 11j, the eleventh dielectric layer 11k, and the twelfth dielectric layer 11 strip electrodes Lp1 to Lp9 which are each formed of conducting layers are print-formed.

On respective upper surfaces of the ninth and the thirteenth dielectric layers 11i and 11m, grounding electrodes Gp1 and Gp2 which are formed of conducting layers are print-formed. On a lower surface of the thirteenth dielectric layer 11m (FIG. 4F), are print-formed the external terminals Ta and Tc (FIG. 2) which respectively function as the first port P1 and the second port P2, the external terminals Tb and Te (FIG. 2) which each function as the grounding terminals, and the external terminals Td and Tf (FIG. 2) which each function as the control terminals.

The capacitor electrodes Cp1 to Cp4 form the capacitor C11 (FIG. 1). The strip electrodes Lp1, Lp3, and Lp5 form the transmission line L11 (FIG. 1), the strip electrodes Lp7 to Lp9 form the resonator RES11 (FIG. 1), and the strip electrodes Lp2, Lp4, and Lp6 form the choke coil CC11 (FIG. 1).

Figure 5A:
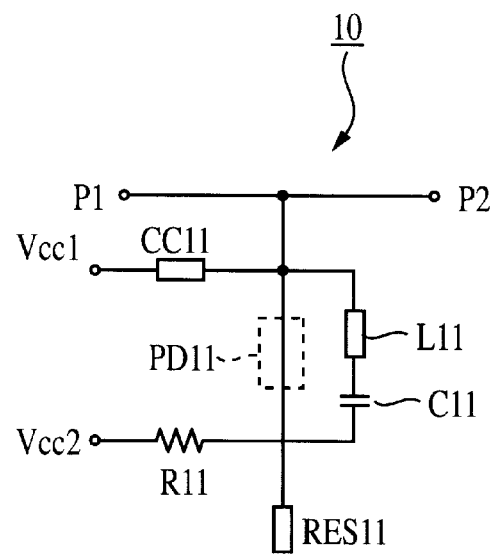
FIG. 5A is an equivalent circuit diagram when a pin diode of the filter in FIG. 1 is turned ON and FIG. 5B is an equivalent circuit diagram when the pin diode of the filter in FIG. 1 is turned OFF.

Hereinbelow, a description will be given of the performance of the filter 10 structured as described above. When the pin diode PD11 is turned ON (Vcc1=3 V, Vcc2=0 V), it turns short; in which an equivalent circuit is as shown in FIG. 5(a). Therefore, a circuit formed of the transmission line L11, the resonator RES11, and the pin diode PD11 becomes a circuit formed of only the resonator RES11; by which high-frequency signals having a wavelength of four times that of the resonator RES11 can be prevented from flowing in.

Figure 5B:
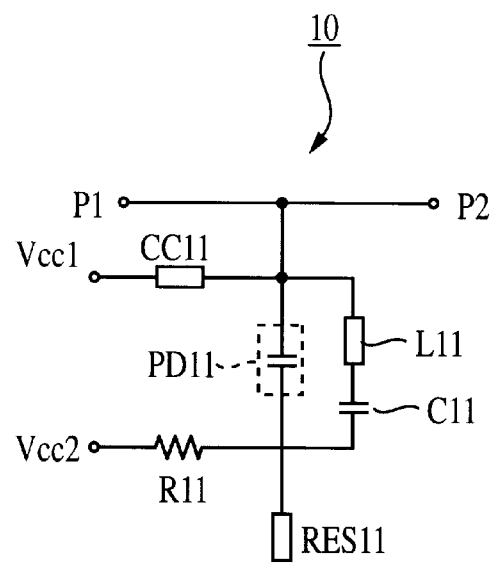

On the other hand, when the pin diode PD11 is turned OFF (Vcc1=0 V, Vcc2=3 V), it turns open; in which an equivalent circuit is as shown in FIG. 5B. Therefore, a circuit formed of the transmission line L11, the resonator RES11, and pin diode PD11 becomes an LC resonator circuit formed of the transmission line L11 and the pin diode PD11; by which high-frequency signals having a resonating frequency of this LC resonator circuit can be prevented from flowing in.

In such a structure, the frequency band of high-frequency signals passthrough the filter 10 can be changed by turning the pin diode PD11 ON or OFF.

Figure 6:
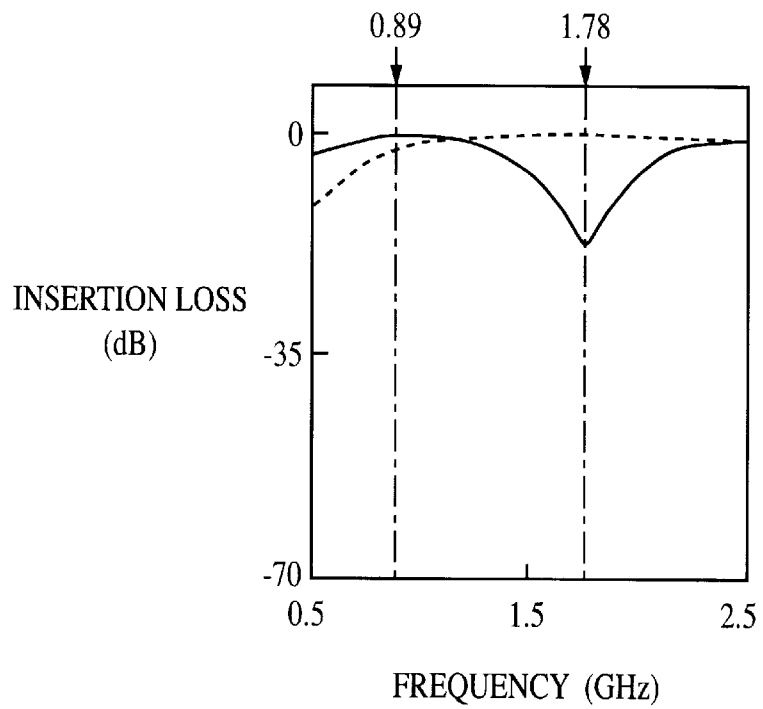
FIG. 6 is a graph showing frequency characteristics of the filter in FIG. 1.

FIG. 6 shows the pass-through characteristics of the filter 10. In FIG. 6, the solid line indicates the characteristics when the pin diode PD11 is ON, and the broken line indicates the characteristics when the pin diode PD11 is OFF. This figure apparently indicates that (A) when the pin diode PD11 is ON, a high-frequency signal of 900 MHz can be passed through, and (B) when the pin diode PD11 is OFF, a high-frequency signal of 1.8 GHz can be passed through.

Figure 7:
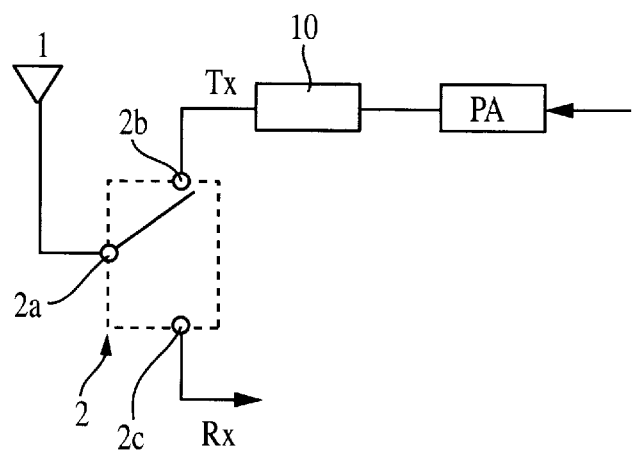
FIG. 7 is a block diagram showing a structure in which the filter in FIG. 1 is used and an antenna is shared by mobile communication apparatuses of different frequency bands.

An application example of an arrangement is shown in FIG. 7, in which the aforementioned filter 10 is used for a transmitter member Tx between two frequency bands which are relatively adjacent to each other, for example, between a GSM (global system for mobile communications), which is a 900-MHz band mobile phone system, and a DCS (dynamic cell system), which is a 1.8-GHz band mobile phone system.

An antenna 1 is connected to a first terminal 2a of a second switch comprised of a coaxial switch, a PIN diode switch, or the like. A transmitter member Tx and a receiver member Rx are connected to a second terminal 2b and a third terminal 2c of the second switch, which are a transmitting terminal and a receiving terminal, respectively. In the transmitter member Tx, one of the terminals of the filter 10 is connected to the second terminal 2b of a switch 2, while the other terminal is connected to a high-output amplifier PA that is shared by the 900-MHz band GSM and the 1.8-GHz DCS.

In such a structure, in the case of two different frequency bands, for example, when the pin diode PD11 of the filter 10 is ON, only a transmitting signal of a GSM frequency of 900 MHz is passed through, while when the pin diode PD11 of the filter 10 is OFF. a transmitting signal of a DCS frequency of 1.8 GHz can be passed through.

The above indicates that high-frequency signals of the 900-MHz band GSM and the 1.8-MHz band DCS can be distributed and coupled, allowing communication in two high-frequency bands to be achieved.

Accordingly, an antenna and a transmitting-side high-output amplifier can be shared by the 900-MHz band GSM and 1.8-MHz band DCS, which are two high-frequency signal bands that are relatively adjacent to each other.

According to the filter 10 of the first preferred embodiment, as described above, the equivalent circuit of the circuit formed of the transmission line, the resonator, and the pin diode can be changed by changing the voltage applied to the pin diode to turn it ON or OFF. This allows the frequency band of high-frequency signals which pass through the filter, which is a low-pass filter, to be changed; in which a single filter is enabled to sufficiently function for two high-frequency signals having two different frequency bands. Accordingly, mobile communication apparatuses having this filter can be smaller.

Furthermore, since the resonator is an open-stub resonator, it is not influenced by parasitic inductance of the pin diode; therefore, an increased insertion-loss attenuation can be established.

Furthermore, as shown in FIG. 2, when the filter is formed of the multilayered body, the transmission line can be formed inside the multilayered body. This allows the filter to be formed smaller.

Figure 8:
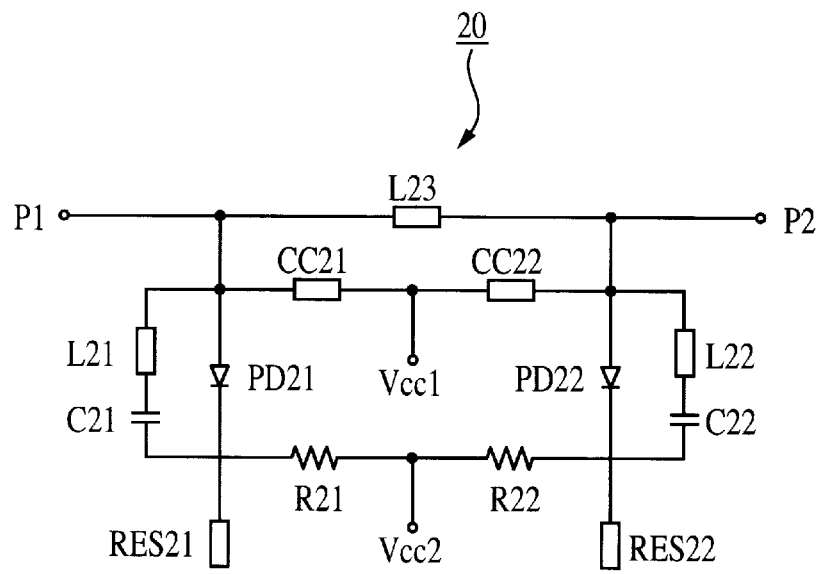
FIG. 8 is a circuit diagram showing a filter according to a second preferred embodiment of the present invention.

FIG. 8 is a circuit diagram of a filter in accordance with a second preferred embodiment of the present invention. A filter 20 is a low-pass filter and it is formed of transmission lines L21 to L23 which are inductance devices, open-stub resonators RES21 and RES22, pin diodes PD21 and PD22 which are switching devices, capacitors C21 and C22, choke coils CC21 and CC22, and resistors R21 and R22.

The pin diode PD21 and the resonator RES21, and the pin diode PD22 and the resonator RES22 are π-connected to portions, respectively, between a first port P1 and a second port P2. A series circuit, which is formed of the transmission line L21 and the capacitor C21, and a series circuit, which is formed of the transmission line L22 and the capacitor C22, are parallel-connected to the pin diode PD21 and the pin diode PD22, respectively.

A control terminal Vcc1 is connected to a junction of the transmission line L21 and an anode of the pin diode PD22 through the choke coils CC21 and CC22. Further, a control terminal Vcc2 is connected to a junction of the capacitor C22 and a cathode of the pin diode PD22 through the resistors R21 and R22.

For reference, the anode of the pin diode PD21 and the anode of the pin diode PD22 are connected through the transmission line L23. That is, the filter 20 has a structure in which the filter 10 of the first embodiment (FIG. 1) is series-connected between the first port P1 and the second port P2 through the transmission line L23.

In this structure, the capacitors C21 and C22 each prevent a direct current from flowing into the transmission lines L21 and L22. Furthermore, the choke coils CC21 and CC22 and the resistors R21 and R22 prevent high-frequency signals from leaking into the control terminals Vcc1 and Vcc2 when voltage is applied to the pin diodes PD21 and PD22. It is notable that the resistors R21 and R22 also reduce power consumption.

Figure 9:
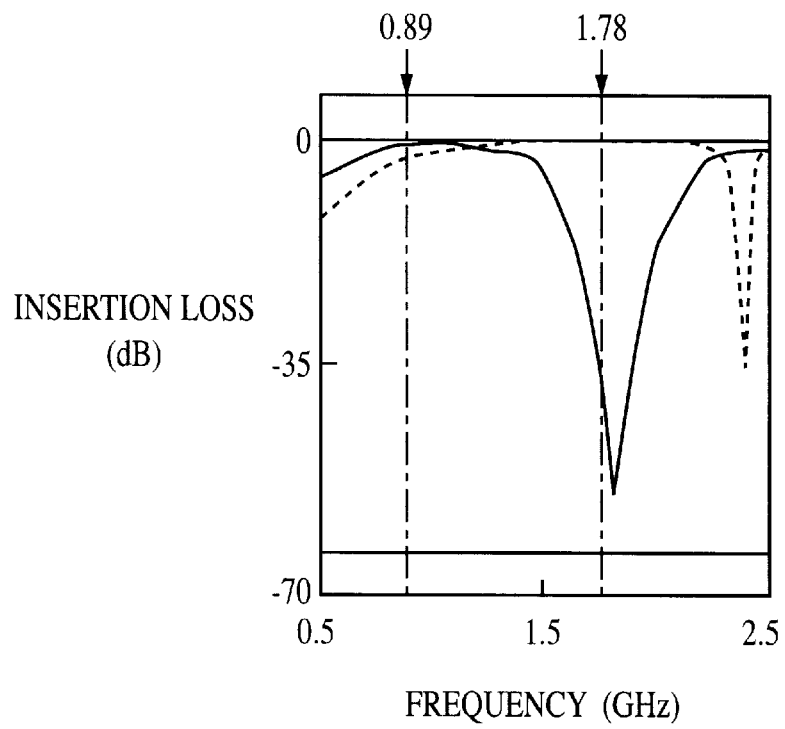
FIG. 9 is a graph showing frequency characteristics of the filter in FIG. 8.
Figure 10:
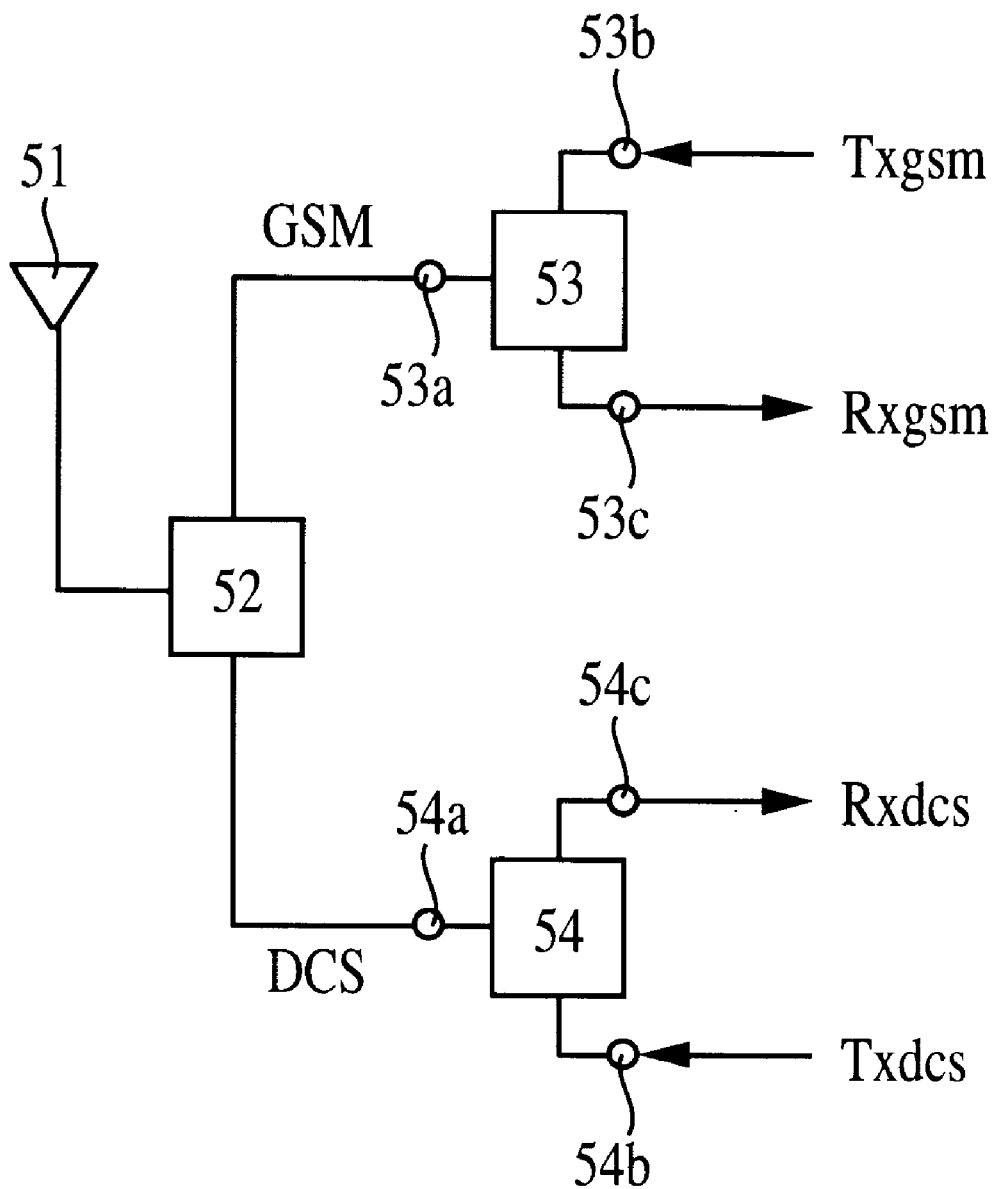
FIG. 10 is a block diagram showing a structure in which an antenna is shared by conventional mobile communication apparatuses of different bands.

FIG. 9 is a graph showing frequency characteristics of the filter 20. In FIG. 9, a dot line indicates characteristics when the pin diodes PD21 and PD22 are ON (Vcc1=3 V, Vcc2=0 V), while a broken line indicates characteristics when the pin diodes PD21 and PD22 are OFF (Vcc1=0 V, Vcc2=3 V). This figure apparently indicates that (A) when the pin diodes PD21 and PD22 are ON, a high-frequency signal of 900 MHz can be passed through, and (B) when the pin diodes PD21 and PD22 are OFF, a high-frequency signal of 1.8 GHz can be passed through.

The above indicates that, with the structure of the filter 20 (FIG. 7), the frequency band of the high-frequency signals pass-through the filter 20 can be changed by turning the pin diodes PD21 and PD22 ON or OFF.

According to the aforementioned filter of the second preferred embodiment, two resonators are used to allow the insertion-loss attenuation to be greater than that of the filter of the first embodiment which has only a single resonator. That is, the larger the number of resonators used, the greater the insertion-loss attenuation will be.

For reference, in the aforementioned first and second embodiments, the filter is a low-pass filter; however, filters such as high-pass filters, band-pass filters, and band-rejection filters which have inductance devices, resonators, and switching devices are all within the scope of the present invention.

Furthermore, although arrangements in which pin diodes are used as switching devices are already described, varicap diodes, bipolar transistors, or field-effect transistors may be used to provide the same effect as in the aforementioned embodiments.

Furthermore, although arrangements in which a choke coil or a resistor through which the control terminal is connected is used are already described, the device may be any alternative device as long as it works to prevent high-frequency signals from flowing into the control terminal during the voltage application to the pin diode.

Furthermore, although arrangements in which inductance devices and capacitance devices are formed inside a multi-layered body formed of dielectric layers are already described, chip devices may be mounted on the multilayered body.

Furthermore, arrangements in which switching devices are mounted on the multilayered body are already described, but an arrangement may be such that cavities or the like are formed inside the multilayered body and through the cavities or the like switching devices are formed inside the body.

Furthermore, although an arrangement in which the filter according to the present invention is used in the case of coupling between a GSM and a DCS is already described, the use of the filter is not restricted to the case of coupling between the systems of the GSM and the DCS, but the filter may be used in other cases of coupling between systems of, for example, the GSM and a DCS (digital cellular system), the GSM and a PCS (personal communication services), an AMPS (advanced mobile phone services) and the PCS, the GSM and a DECT (Digital European Cordless Telephone), and the PDC and a PHS (personal handy-phone system).

While the invention has been particularly shown and described with reference to preferred embodiments thereof, it will be understood by those skilled in the art that the forgoing and other changes in form and details may be made therein without departing from the spirit of the invention.

What is claimed is:

1. A filter, comprising:
   at least one inductance device, at least one resonator, and at least one switching device, wherein:
   said at least one inductance device is connected in parallel with a corresponding said at least one switching device, and said at least one resonator is connected in series with said corresponding at least one switching device; and
   said at least one inductive device said at least one resonator, and said at least one switching device are disposed in or mounted on a multilayered body comprising a plurality of dielectric layers.

2. The filter according to claim 1, wherein:

said at least one resonator is an open-stub resonator.

3. A filter, comprising:

at least one inductance device, at least one resonator and at least one switching device, wherein:

said at least one inductance device is connected in parallel with a corresponding said at least one switching device, and said at least one resonator is connected in series with said corresponding at least one switching device;

said at least one resonator is an open-stub resonator.

4. A filter, comprising:

at least one inductance device, at least one resonator, and at least one switching device, wherein:

said at least one inductive device, said at least one resonator, and said at least one switching device are disposed in or mounted on a multilayered body comprising a plurality of dielectric layers;

said at least one resonator is an open-stub resonator.

* * * * *